US006204200B1

United States Patent
Shieh et al.

(10) Patent No.: US 6,204,200 B1
(45) Date of Patent: Mar. 20, 2001

(54) PROCESS SCHEME TO FORM CONTROLLED AIRGAPS BETWEEN INTERCONNECT LINES TO REDUCE CAPACITANCE

(75) Inventors: Benjamin P. Shieh, Santa Clara; Somnath S. Nag, Saratoga, both of CA (US); Richard S. List, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/064,374

(22) Filed: Apr. 22, 1998

(Under 37 CFR 1.47)

Related U.S. Application Data

(60) Provisional application No. 60/045,626, filed on May 5, 1997.

(51) Int. Cl.[7] ........................... H01L 21/31; H01L 21/469
(52) U.S. Cl. ...................... 438/778; 438/411; 438/421; 438/422
(58) Field of Search ....................... 438/411, 421, 438/422, 778; 257/714

(56) References Cited

U.S. PATENT DOCUMENTS

| 5,324,683 | * | 6/1994 | Fitch et al. | 438/422 |
| 5,679,606 | * | 10/1997 | Wang et al. | 438/776 |
| 5,728,631 | * | 3/1998 | Wang | 438/422 |
| 5,837,618 | * | 11/1998 | Avanzino et al. | 438/778 |
| 6,031,286 | * | 2/2000 | Levine et al. | 257/714 |

OTHER PUBLICATIONS

Wolf and Tauber, "Silicon Processing for the VLSI Era", V1—Process Technology, chp. 6, 1986.*

* cited by examiner

Primary Examiner—Richard Elms
Assistant Examiner—Christian D. Wilson
(74) Attorney, Agent, or Firm—Jacqueline J. Garner; W. James Brady, III; Frederick J. Telecky, Jr.

(57) ABSTRACT

A process for forming controlled airgaps (22) between metal lines (16). A two-step high density plasma (HDP) chemical vapor deposition (CVD) process is used to form the silicon dioxide dielectric layer (20) with the controlled airgaps (22). The first step involves a high gas flow and low substrate bias conditions to deposit silicon dioxide with a high deposition to sputter etch ratio. The second step uses a low gas flow and high substrate bias condition to increase the sputter component of the deposition.

17 Claims, 4 Drawing Sheets

continues…

PROCESS SCHEME TO FORM CONTROLLED AIRGAPS BETWEEN INTERCONNECT LINES TO REDUCE CAPACITANCE

This application claims priority under 35 USC § 119 (e) (1) of provisional application Ser. No. 60/045,626, filed May 5, 1997.

FIELD OF THE INVENTION

The invention is generally related to the field of interconnect layers for semiconductor devices and more specifically to forming airgaps between interconnect lines to reduce capacitance.

BACKGROUND OF THE INVENTION

For current integrated circuit (IC) technology, the speed limiting factor is no longer the transistor gate delay, but the RC delays associated with the interconnects. For this reason, a great deal of work has been done on developing new low dielectric constant materials to reduce interconnect capacitance. Some of these dielectrics include fluorinated silicon dioxide, polymers, and xerogels. However, these material currently pose numerous reliability, manufacturability, and integration issues. Some of these include 1) mechanical strength; 2) dimensional stability; 3) thermal stability; 4) ease of pattern and etch; 5) thermal conductivity; and 6) chemical-mechanical polish (CMP) compatibility. Most low dielectric constant materials under investigation are, as currently developed, inferior to the currently used intermetal dielectric material, silicon dioxide, in most if not all of the above properties.

Also, as IC's continue to scale, the intralevel line-to-line capacitance increasingly dominates over the interlevel capacitance. Thus, it becomes increasingly important that the low dielectric constant material be used between adjacent metal lines and less so between metal levels. Moreover, since tighter metal spacings have increased capacitance, the need for low dielectric constant material there is greater.

SUMMARY OF THE INVENTION

A process for forming controlled airgaps between metal lines is disclosed herein. A two-step high density plasma (HDP) chemical vapor deposition (CVD) process is used to form the silicon dioxide dielectric layer with the controlled airgaps. The first step involves a high gas flow and low substrate bias conditions to deposit silicon dioxide with a high deposition to sputter etch ratio. The second step uses a low gas flow and high substrate bias condition to increase the sputter component of the deposition.

An advantage of the invention is providing a low capacitance intrametal dielectric that can be used with current backend processes.

Another advantage of the invention is providing a interlevel dielectric that maintains the mechanical stability, thermal conductivity, and thermal stability of current processes.

Another advantage of the invention is providing a interlevel dielectric that does not cause outgassing as many of the proposed low K materials do.

Another advantage of the invention is providing a interlevel dielectric that is compatible with scaling trends (i.e., airgaps tend to form more easily in tighter metal spaces where capacitance reduction is most required) .

These and other advantages will be apparent to those of ordinary skill in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF THE EMBODIMENTS

The invention will now be described in conjunction with forming a silicon dioxide interlevel dielectric layer having airgaps between metal lines to reduce capacitance. It will be apparent to those or ordinary skill in the art that the benefits of the inventions may be applied more generally to forming airgaps within an IC.

In an embodiment of the invention, the dominating line-to-line capacitance of interconnects is reduced by the formation of controlled airgaps between metal lines. The airgaps are formed during a dielectric (e.g., silicon dioxide) deposition using a two step HDP CVD process. The HDP CVD process allows repeated control over the airgap size, shape and location within the metal spacing. The use of airgaps introduces a dielectric with a dielectric constant approaching 1 between metal lines, reducing the dominant capacitance. At the same time, if SiO2 is used as the dielectric, a thin layer of SiO2 on the metal line sidewalls guards against potential electromigration issues. Airgaps also leave the SiO2 material between metal levels intact, alleviating many of the reliability and integration issues associated with low dielectric constant materials. As an alternative, a low dielectric constant can be used in the intermetal spacing instead of SiO2 by using CMP until the SiO2 is remove to just above the airgap seam and then depositing the low dielectric constant material.

Figure 1:
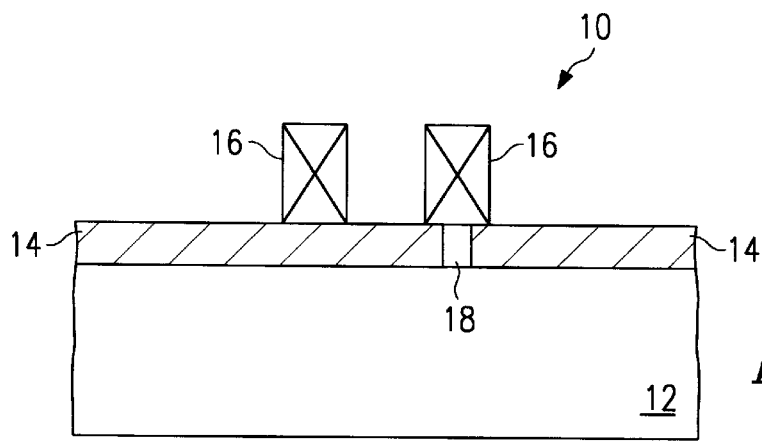
FIGS. 1–2 and 5A&B are cross-sectional diagrams of the interconnect layer including controlled airgaps according to an embodiment of the invention at various stages of fabrication.

The IC 10 is processed through the formation of metal interconnect lines 16, as shown in FIG. 1. Semiconductor body 12 has transistors and the like (not shown) formed therein as is standard in the art. Dielectric layer 14 isolates metal lines 16 from semiconductor body 12 except where contact/vias 18 are formed. As shown, metal lines 16 form a first metal interconnect layer. Typically, there are several metal interconnect layers separated vertically by interlevel dielectric layers. The embodiment of the invention may be applied to any one, several, or all of the metal interconnect layers.

Figure 2:
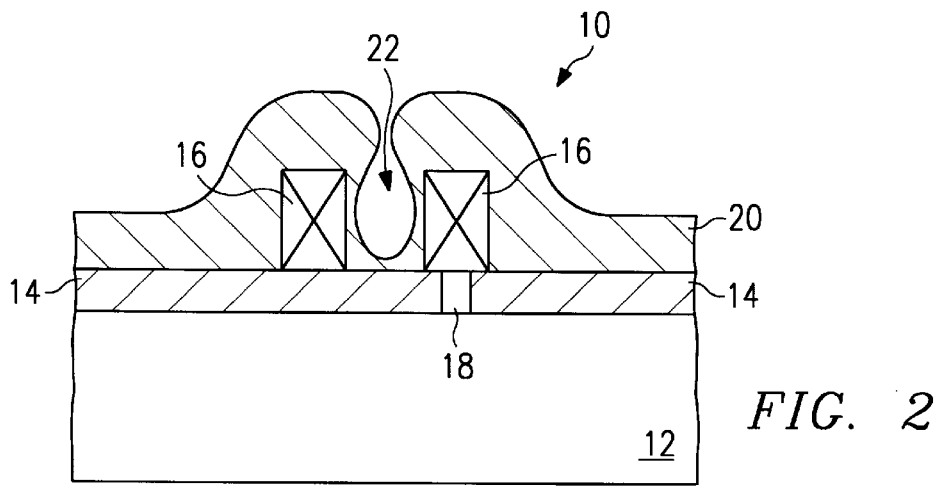

The formation of airgaps is done with a two step HDP CVD deposition. Both steps are carried out in the same chamber in a continuous process without an airbreak. The first step involves the use of a high gas flow, low substrate bias condition to deposit the SiO2 layer 20 with a high deposition to sputter etch ratio (D/S_R). A high gas flow increases the deposition component of the D/S_R while a low substrate bias reduces the etch component. For the first step, the DIS_R is greater than 5, preferably in the range of 16.5 or greater. As the D/S_R increases, so does the size of the airgap. The high deposition to sputter etch ratio conditions cause breadloafing of layer 20 on the metal lines, as shown in FIG. 2. The breadloafing causes initial voids 22 to form.

Figure 3:
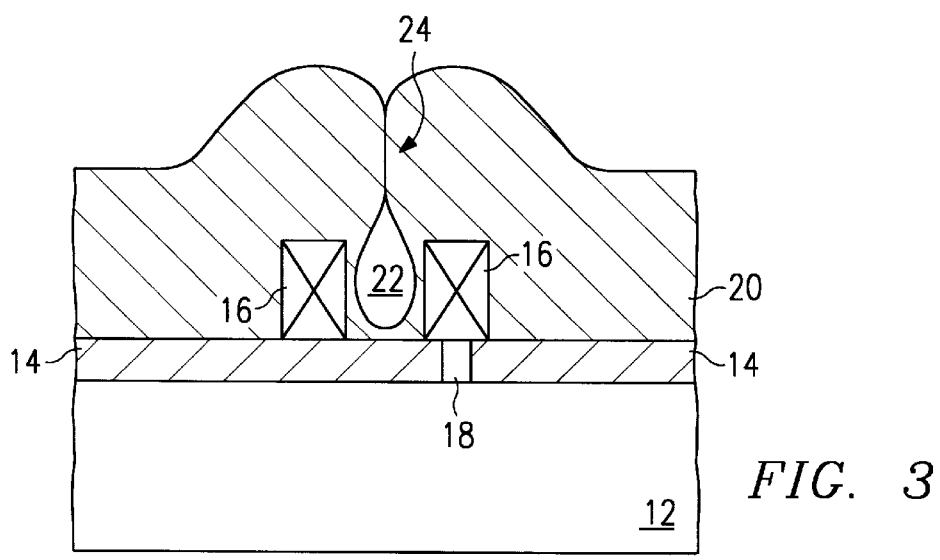
FIG. 3 is a cross-sectional diagram of an interlevel dielectric layer having a seam above an airgap.
Figure 4:
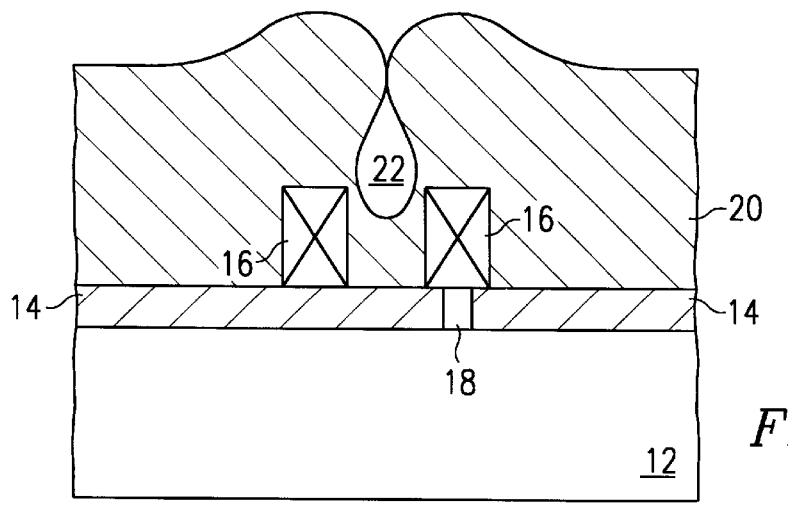
FIG. 4 is a cross-sectional diagram of an interlevel dielectric layer having a void extending too far above the metal lines.

If the first step were allowed to continue, the breadloafing would eventually pinch-off the void 22. However, a seam 24 would continue to form above the metal lines 16 as shown in FIG. 3. Additionally, the wider the spacing between metal lines 16, the higher the void 22 extends above the metal lines. This is shown in FIG. 4. A seam 24 or void 22 extending significantly above the metal lines 16 is in danger of being opened up or compromised during subsequent CMP.

Figure 5A:
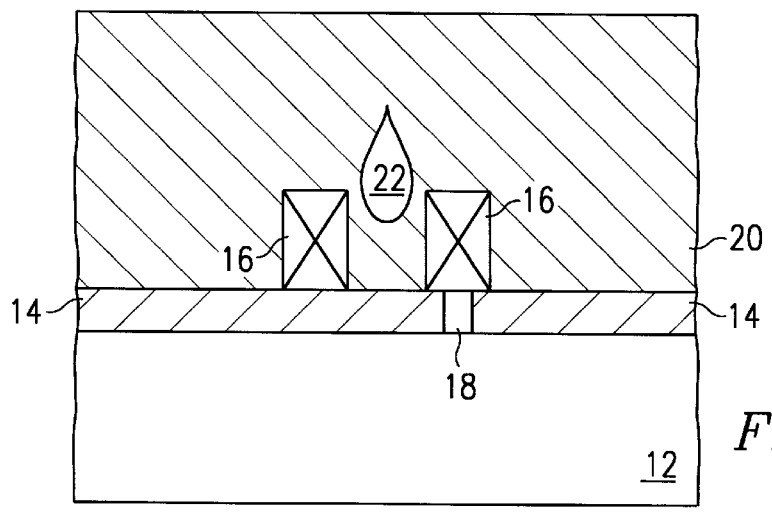
Figure 5B:
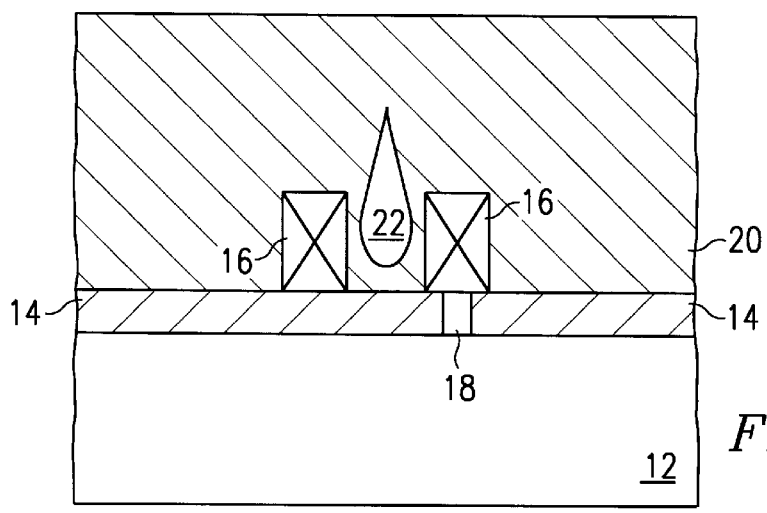

To limit the extensions of the seam 24 or voids 22 above the metal lines 16, the second step of the process uses a low gas flow, high substrate bias condition to increase the sputter component to deposition. Low gas flow decreases the deposition component of the D/S_R and the high substrate bias increases the sputter component. The D/S_R for the second step is less than 5, for example, on the order of 2.9. This induces a controlled pinch-off at the desired height above the metal lines 16 and prevents a seam from forming, as shown in FIGS. 5A&B. Thus, significant void 22 extension above wider spaced metal lines is prevented (FIG. 5A) as well as seam formation in tighter line spacings (FIG. 5B). The second step also provides local planarization characteristic of HDP CVD processes.

It should be noted that the transition from the first step to the second step involves a simple change in gas flow and substrate bias. In this way, both steps are done in the same chamber without airbreak and the transition from one step to the other is practically instantaneous. This not only improves process integrity but increases throughput, reducing the cost of ownership.

For the first step using low substrate bias and high gas flow, the following conditions were evaluated for forming a void: Source RF power on the order of 3000 W, bias RF power in the range of 200–1250 W, O2 flow of 39–196 sccm, SiH4 flow of 27.7–98 sccm, Ar flow on the order of 20 sccm and O2/SiH4 ratio of 1.4–2. These parameters yield deposition to sputter etch ratios ranging from 2.9 to 16.63. The oxide quality of the resulting film is good. Oxide quality is confirmed by measuring the refractive index and wet etch rates of blanket films in 0.49% buffered HF. The above conditions result in a refractive index between 1.455 and 1.47 indicating that the oxide is not too silicon rich. The wet etch rate of the films does not exceed 1.55 times the etch rate of thermal oxide indicating good film quality.

Figure 6:
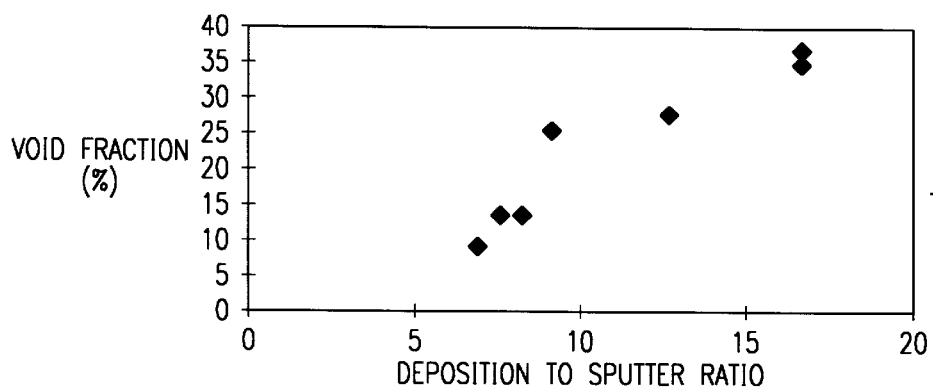
FIG. 6 is a graph of void fraction versus deposition to sputter ratio.

FIG. 6 is a graph of void fraction versus deposition to sputter etch ratio for a metal line spacing of 0.3 microns. As the deposition to sputter etch ratio increases, so does the void fraction or size of the void. Void fraction is a figure of merit number defined as the fraction of the cross-sectional area between the metal lines occupied by the void. It does not include the portion of the void extending above the metal lines. A large void fraction is desirable as is results in a larger reduction in capacitance. As FIG. 6 shows, void fractions above 35% are obtainable.

Figure 7:
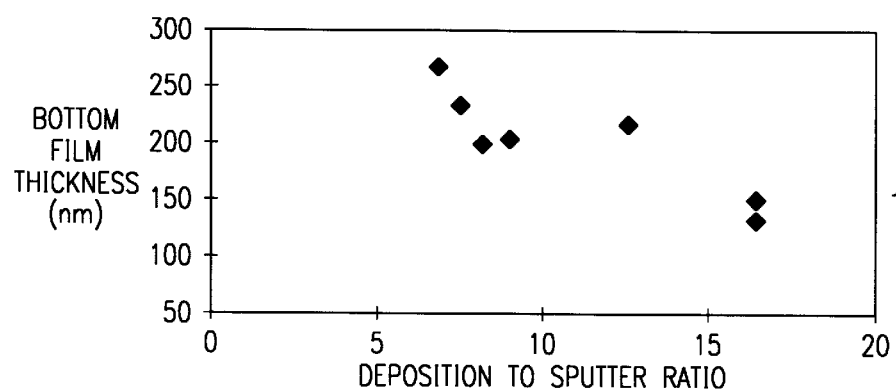
FIG. 7 is a graph of bottom film thickness versus deposition to sputter ratio.

FIG. 7 is a graph of bottom film thickness versus deposition to sputter etch ratio (D/S_R). The bottom film thickness may be measured from the bottom of the void to the bottom of the metal lines. As the D/S_R increases, the bottom film thickness decreases. This indicates that a higher D/S_R is desirable. As can be determined from FIG. 7, bottom thicknesses less that 150 nm are easily obtainable.

Figure 8:
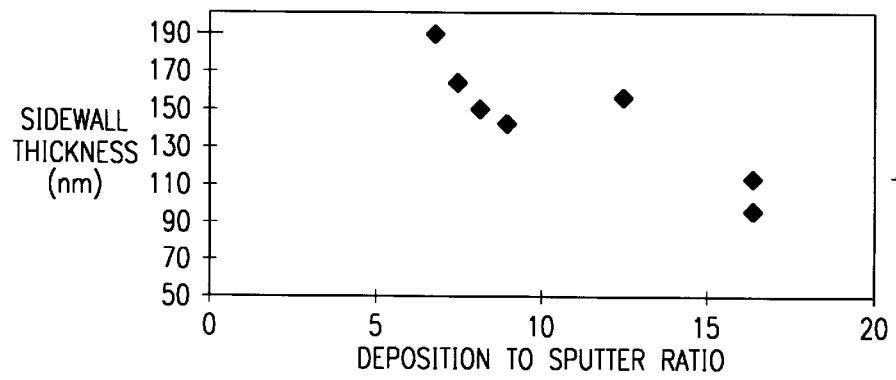
FIG. 8 is a graph of sidewall thickness versus deposition to sputter ratio.

FIG. 8 is a graph of sidewall thickness to D/S_R. Sidewall thickness may be measured from the side of the void to the side of the metal line using a SEM photograph. As the D/S_R increases, the sidewall thickness decreases. For a D/S_R on the order of 16, a sidewall thickness on the order of 90–110 nm is obtainable.

Given the above, a preferred embodiment of the invention uses the following parameters for the first step: Source RF power on the order of 3000 W, bias RF power on the order of 200–600 W, O2 flow on the order of 196 sccm, SiH4 flow on the order of 98 sccm, and Ar flow on the order of 20 sccm. The preferred embodiment uses the following parameters for the second step: Source RF power on the order of 3000 W, bias RF power on the order of 1250 W, O2 flow on the order of 39 sccm, SiH4 flow on the order of 27.7 sccm, and Ar flow on the order of 20 sccm.

The duration of the first step is determined based on the process parameters and the size of the metal line spacings. For a 0.3 micron spacing, a duration in the range of 40–60 seconds using the preferred parameters listed above is appropriate. The duration of the second step is chosen to achieve the desired total film thickness in the field regions. As an example, the total desired thickness in the field regions may be on the order of 1.8 microns.

After the formation of SiO2 layer 20 with airgaps 22, processing may continue in the standard way. Additional metal interconnect layers may be formed. If desired, some or all of the additional metal interconnect layers may also include the process of the invention.

Figure 9:
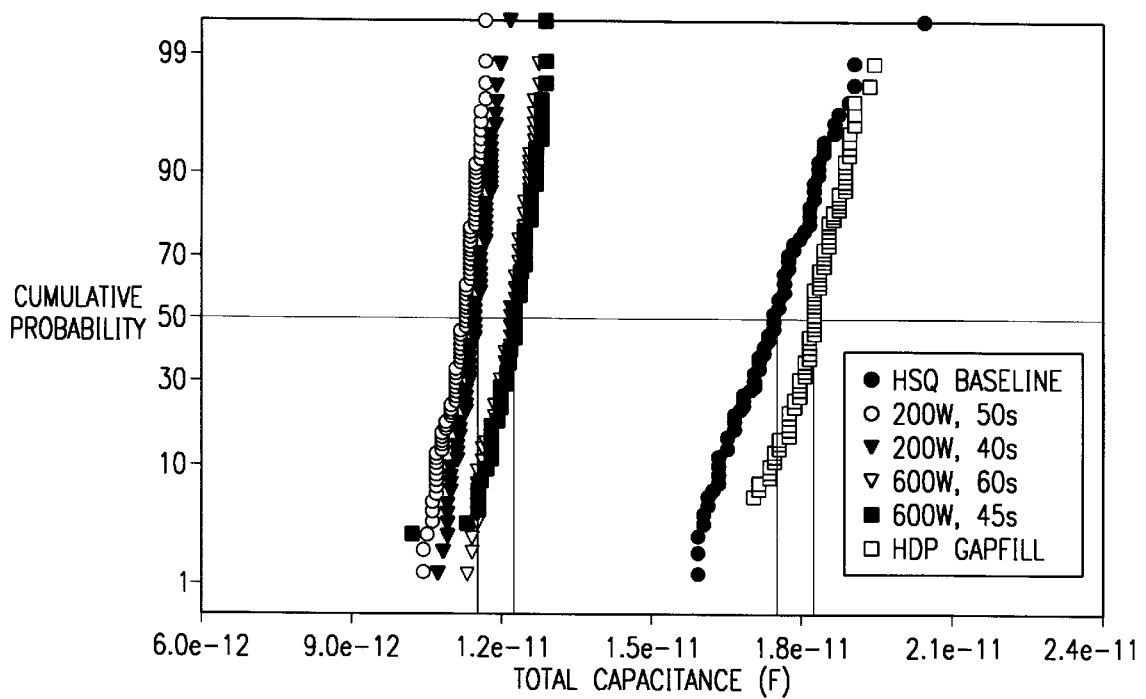
FIG. 9 is a graph of capacitance for a 0.3 micron line width and spacing.
Figure 10:
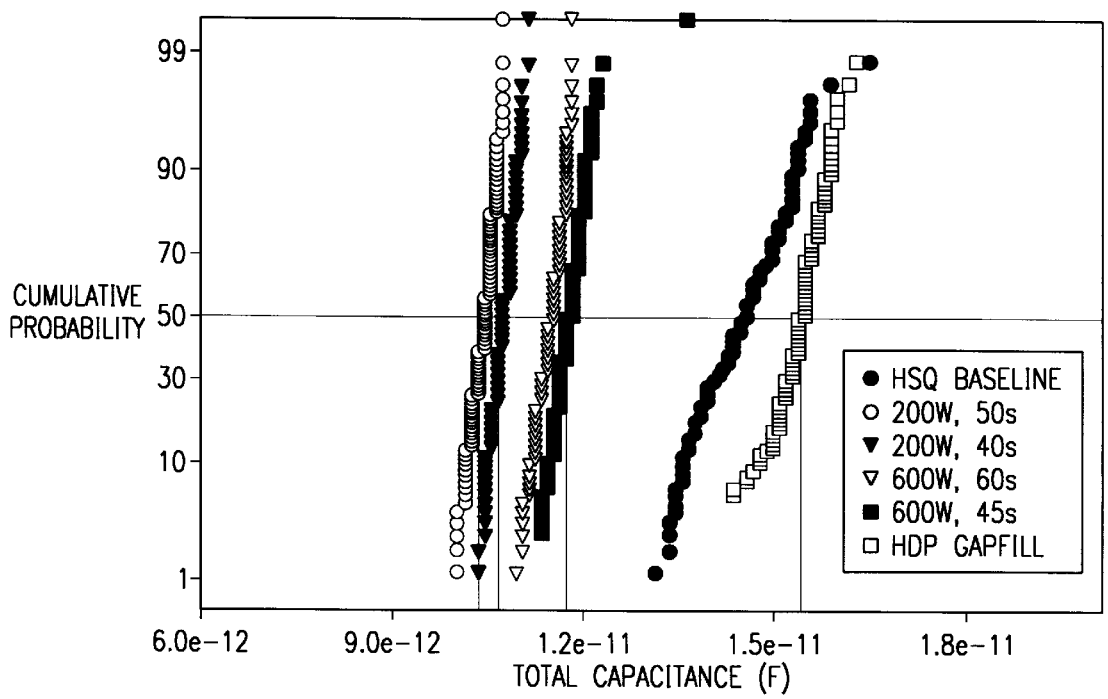
FIG. 10 is a graph of capacitance for a 0.4 micron line width and spacing.

FIGS. 9 and 10 are graphs of capacitance data. At 0.3 micron line width and spacing, a 33–40% reduction in capacitance can be achieved using the preferred embodiment of the invention, as shown in FIG. 9. For a 0.4 micron linewidth and spacing, a 25–33% reduction in capacitance can be achieved using the preferred embodiment parameters, as shown in FIG. 10.

It will be apparent to those of ordinary skill in the art that further optimizations of the void formation process will result in even further reductions in capacitance. For example, overetching into the underlying oxide during metal etch before the two step process of the invention would decrease the bottom film thickness between the metal lines. Also, more vertical metal sidewalls would increase the void fraction.

This embodiment of the invention offers several advantages over the use of other low k dielectric materials. First, only minimal changes to the current backend process are required. Once the airgaps are formed, the rest of the backend process remains the same since there are no new materials involved. Via and etch chemistries remain the same. Similarly, CMP recipes can remain the same.

Second, the mechanical integrity of the backend process is maintained. The SiO2 interlevel dielectric (between interconnect layer) is left intact. SiO2 still fills the wide spaces between metal lines. Even for narrow spaces, there is always a layer of SiO2 on the metal sidewalls acting as a barrier to the metal movement due to electromigration. Low dielectric constant materials, for the most part, have lower mechanical strength than SiO2, which may lead to electromigration problems. Electromigration for this embodiment of the invention has been found to be comparable to HDP CVD gap fill schemes.

Third, the thermal conductivity of the interconnect layer stack is maintained. Most low dielectric constant material have poor thermal conductivity. This is an issue when resistive heating increases the chip temperature, adversely affecting performance and reliability. Because the SiO2 interlevel dielectric is maintained in the embodiment of the invention, the thermal conductivity of the interconnect stack is dose to that of the current technology.

Fourth, thermal stability is maintained. Many low dielectric constant materials, especially polymers, have poor thermal stability so that processing temperatures must be severely limited. With airgaps, the process temperature limitations are that same as those currently used.

Fifth, no outgassing occurs with airgaps. In fluorinated low dielectric constant materials, fluorine can outgas into the metal lines and vias. Fluorine can severely increase the resistance of the metal lines and vias. This is not a problem with airgaps.

Sixth, airgaps are compatible with scaling trends. As ICs continue to scale, the aspect ratio of interconnect geometries increases. As the aspect ratio increases, airgaps actually become easier to form.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an airgap between two structures, comprising the steps of:

depositing a layer of material over said two structures using a two-step CVD HDP process, wherein a first of said two steps uses a high gas flow rate of at least one gas and a low substrate bias power to create a void between said two structures and a second of said two steps uses a low gas flow rate of said at least one gas and a high substrate bias power to prevent a seam from forming in said layer above said void.

2. The method of claim 1, wherein said layer of material comprises silicon dioxide.

3. The method of claim 1, wherein said first and second steps are performed in the same chamber.

4. The method of claim 1, wherein said first step transitions to said second step in a continuous manner.

5. The method of claim 1, wherein said first step has a duration in the range of 40–60 seconds.

6. The method of claim 1, wherein the deposition to sputter etch ratio for the first step is greater than 5.

7. The method of claim 1, wherein the deposition to sputter etch ratio for the first step is greater than 10.

8. The method of claim 1, wherein the deposition to sputter etch ratio for the second step is less than 5.

9. The method of claim 1, wherein the deposition to sputter etch ratio for the second step is approximately 2.9.

10. The method of claim 1, the deposition to sputter etch ratio of the first step is approximately 16.

11. A method of fabricating a silicon dioxide interlevel dielectric layer having an airgap between two narrowly spaced metal lines, comprising the steps of:

depositing said silicon dioxide interlevel dielectric layer using a two step chemical vapor deposition process in a high density plasma processing chamber, wherein the first of said two steps uses a high gas flow rate of at least one gas and a low substrate bias power to create a void and wherein the second of said two steps uses a low gas flow rate of said at least one gas and a high substrate bias power to prevent the formation of a seam in said silicon dioxide interlevel dielectric layer.

12. The method of claim 11, wherein said first and second steps are performed in the same chamber.

13. The method of claim 11, wherein said first step transitions to said second step in a continuous manner.

14. The method of claim 11, wherein said first step has a duration in the range of 40–60 seconds.

15. The method of claim 11, wherein said first step uses a source RF power of approximately 3000 W, a substrate bias power in the range of 200–600 W, an O2 gas flow rate of approximately 198 sccm, a SiH4 gas flow rate approximately 98 sccm, and an Ar gas flow rate of approximately 20 sccm.

16. The method of claim 11, wherein said second step uses a source RF power of approximately 3000 W, a substrate bias RF power of approximately 1250 W, a O2 gas flow rate of approximately 39 sccm, a SiH4 gas flow rate of approximately 28 sccm, and an Ar gas flow rate of approximately 20 sccm.

17. The method of claim 11, wherein the deposition to sputter etch ratio of the first step is greater than 5.

* * * * *